(12) United States Patent
Ishii (10) Patent No.: US 8,330,161 B2
(45) Date of Patent: Dec. 11, 2012

(54) ELECTRONIC PHOTOSENSITIVE BODY AND MANUFACTURING METHOD FOR SAME, AS WELL AS IMAGE FORMING APPARATUS

(75) Inventor: Yoshinobu Ishii, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 317 days.

(21) Appl. No.: 12/671,469

(22) PCT Filed: Jul. 31, 2008

(86) PCT No.: PCT/JP2008/063804
§ 371 (c)(1),
(2), (4) Date: May 24, 2010

(87) PCT Pub. No.: WO2009/017207
PCT Pub. Date: Feb. 5, 2009

(65) Prior Publication Data
US 2010/0224877 A1 Sep. 9, 2010

(30) Foreign Application Priority Data
Jul. 31, 2007 (JP) .................. 2007-200241

(51) Int. Cl.
*H01L 29/04* (2006.01)
*H01L 31/00* (2006.01)
(52) U.S. Cl. ............. 257/53; 257/65; 257/77; 257/431; 257/E31.047; 257/E31.051; 438/96; 438/97; 399/117; 430/336
(58) Field of Classification Search .......... 257/53, 257/65, 77, 431, E31.047, E31.051; 438/96, 438/97; 399/117; 430/336
See application file for complete search history.

(56) References Cited

U.S. PATENT DOCUMENTS

| 4,641,158 | A | | 2/1987 | Takeuchi | 346/160 |
| 5,738,963 | A | * | 4/1998 | Niino | 430/57.7 |
| 5,939,230 | A | | 8/1999 | Kojima et al. | 430/128 |
| 6,391,394 | B1 | * | 5/2002 | Shirasuna et al. | 427/569 |
| 2002/0051920 | A1 | | 5/2002 | Owaki et al. | 430/66 |
| 2007/0134569 | A1 | | 6/2007 | Nakano | 430/56 |
| 2007/0292177 | A1 | * | 12/2007 | Ishino et al. | 399/350 |
| 2009/0078566 | A1 | | 3/2009 | Ikeda et al. | 204/192.25 |

FOREIGN PATENT DOCUMENTS

JP 60-168187 8/1985
(Continued)

OTHER PUBLICATIONS

Aoki et al., JP 2000-187344 Machine Translation, Translated May 25, 2012, INPIT, 27 pages.*

(Continued)

*Primary Examiner* — Tu-Tu Ho
(74) *Attorney, Agent, or Firm* — DLA Piper LLP (US)

(57) ABSTRACT

Disclosed is an electrophotographic photoreceptor which comprises a base material and a photoconductive layer. The photoconductive layer is formed on the base material, and comprises a non-single-crystal material mainly composed of silicon. In the photoconductive layer, with regard to a characteristic energy E (eV) which has the relationship with a light absorption coefficient $\alpha(cm^{-1})$ represented by the following formula (1), the characteristic energy E1 (eV) for an exposure wavelength in larger than the characteristic energy E2 (eV) for a neutralization wavelength. [Formula (1) $a=C \exp(h\omega/E)$ C: a constant $h\omega$: a photon energy h: a rationalized Planck's $\omega$: the number of frequency.

14 Claims, 5 Drawing Sheets

Sample 1

FOREIGN PATENT DOCUMENTS

| | | |
|---|---|---|
| JP | 62-083470 | 4/1987 |
| JP | 9-311495 A | 12/1997 |
| JP | 11-084700 A | 3/1999 |
| JP | 2000-187344 A | 7/2000 |
| JP | 2002-108032 A | 4/2002 |
| JP | 2007-171805 A | 7/2007 |
| JP | 2007-179025 A | 7/2007 |
| WO | 2006-134781 A1 | 12/2006 |

OTHER PUBLICATIONS

Japanese language office action dated Dec. 27, 2011 and its partial English language translation issued in corresponding Japanese application 2009525456.

* cited by examiner

Sample 2

FIG.7

Sample 3

FIG.8

Sample 4

FIG.9

Sample 5

ELECTRONIC PHOTOSENSITIVE BODY AND MANUFACTURING METHOD FOR SAME, AS WELL AS IMAGE FORMING APPARATUS

CROSS REFERENCE TO RELATED APPLICATION

This application is a national stage of international application No. PCT/JP2008/063804 filed Jul. 31, 2008, which also claims priority to and the benefit of Japanese Patent Application No. 2.007-200241 filed Jul. 31, 2007, the entire content of which are incorporated herein by reference.

BACKGROUND OF THE INVENTION

1. Field of the Invention

The present invention relates to an electronic photosensitive body having a photoconductive layer including a non-single crystal material of which the main body is silicon, and a manufacturing method for the same, as well as an image forming apparatus.

2. Description of Related Art

Methods for forming an image on a recording medium, such as paper, include electronic photography systems. In electronic photography systems, an image is formed on a recording medium by repeatedly carrying out charging, exposure to light, development, transcription and static elimination on a photosensitive body. Electronic photography systems are adopted in copiers and printers. Bases where a photosensitive layer is formed on the surface are used as photosensitive bodies. Photoconductive layers made of amorphous silicon are adopted as photosensitive layers.

During image formation in electronic photography systems, in some cases there is light memory, so that an afterimage generated by exposure to light in a previous copying step affects the following copying step (ghost). Light memory is considered to be generated when photo carriers generated in portions irradiated with intense light during exposure to light are trapped in the photosensitive layer in such a manner as to affect the following charge. In addition, in some cases there is light memory when a portion that is not irradiated with intense light during exposure to light is irradiated with light for static elimination in order to remove the charge. That is to say, in some cases photo carriers generated by light for static elimination, in addition to light for exposure, are trapped in the photosensitive layer, and thus affect the following charge. In particular, irradiation with intense light for static elimination for reducing the effects of light memory during exposure to light makes the effects more significant.

In general a region where absorption changes exponentially for a change in energy can be observed on the low energy side, starting from the absorption end in light absorption spectra of amorphous semiconductors. This region is referred to as exponential tail (Urbach's tail). In this region, the following Formula 1 holds between the optical absorption coefficient α and the photon energy ℏω of incident light. Here, E in Formula 1 is referred to as characteristic energy.

$$\alpha = C \cdot \exp(\hbar\omega/E) \quad \text{[Formula 1]}$$

C: constant
ℏω: photon energy
h: rationalized Planck constant
ω: frequency

The following Formula 2 can be made using the logarithm on both sides in Formula 1.

$$\ln \alpha = (1/E) \cdot \hbar\omega + \ln C \quad \text{[Formula 2]}$$

The inverse number of the characteristic energy E (1/E) corresponds to the inclination when the logarithm (ln α) of the light absorption constant α is taken along the longitudinal axis and the photon energy (ℏω) is taken along the lateral axis. The light absorption spectrum is approximately linear in the exponential tail region. The size of the characteristic energy E in this linear region is mutually related to the amount of carriers captured by the band tail. When the characteristic energy E is small (1/E is large), for example, less carriers are captured by the band tail, and thus, memory can be reduced during exposure to light (see for example Patent Documents 1 and 2).

Patent Document 1 discloses an electronic photography system where the memory can be reduced by keeping the characteristic energy in the photoconductive layer 0.09 eV or less. Patent Document 2 discloses a photoconductive layer, which is formed of a first layer having a characteristic energy E of 50 meV to 65 meV and a second layer having a characteristic energy E of 50 meV to 55 meV, and thus has little memory.

To be sure it is effective to expose a film having little characteristic energy E with an appropriate amount of light in order to reduce memory during exposure to light and static elimination. However, it is necessary for the rate of film formation to be low, or for the gas flow to be large, in order to make the characteristic energy E in the photoconductive layer small, and in either case, a problem arises in terms of the cost of manufacture.

Patent Document 1: Japanese Unexamined Patent Publication S62 (1987)-83470
Patent Document 2: Japanese Patent No. 3754751

BRIEF SUMMARY OF THE INVENTION

An object of the present invention is to provide an electronic photosensitive body having little memory during exposure to light and static elimination at low cost, and a manufacturing method for the same, as well as an image forming apparatus.

The electronic photosensitive body according to one aspect of the present invention includes a base and a photoconductive layer. The above described photoconductive layer is formed on the base and includes a non-single crystal material of which the main component is silicon. In addition, as concerns the characteristic energy E (eV) that satisfies the following Formula 1 in terms of the relationship with the optical absorption coefficient α (cm$^{-1}$) in the above described photoconductive layer, the characteristic energy E1 for the wavelength of light for exposure is more than the characteristic energy E2 (eV) for the wavelength for static elimination.

$$\alpha = C \cdot \exp(\hbar\omega/E) \quad \text{[Formula 1]}$$

C: constant
ℏω: photon energy
h: rationalized Planck constant
ω: frequency

The manufacturing method for an electronic photosensitive body according to another aspect of the present invention is a manufacturing method for the electronic photosensitive body according to the above described invention. This manufacturing method includes: allowing a first conductor to support the above described base in a reaction chamber, introducing a reactive gas atmosphere in the above described reaction chamber, and applying a direct current voltage in pulse form between the above described first conductor and a second conductor that is placed at a distance from the above described first conductor in the above described reaction chamber.

The image forming apparatus according to still another aspect of the present invention includes the above described electronic photosensitive body, an exposure apparatus for exposing the above described electronic photosensitive body to light, and a static eliminator for eliminating static in the above described electronic photosensitive body.

In the electronic photosensitive body according to one embodiment of the present invention, light for static elimination effectively disperses remaining carriers even when the photosensitive layer has a characteristic energy E1 that is relatively large for the wavelength of the light for exposure. Accordingly, in image forming apparatuses having this electronic photosensitive body, light memory can be less likely to remain into the next image formation. In addition, the electronic photosensitive body according to one embodiment of the present invention and the manufacturing method for the same allow for higher productivity, because the rate of film formation for the photosensitive layer is high, and the amount of material gas used is low.

DETAILED DESCRIPTION OF THE INVENTION

The image forming apparatus 1 according to the present invention is described in reference to FIGS. 1 to 4.

Figure 1:
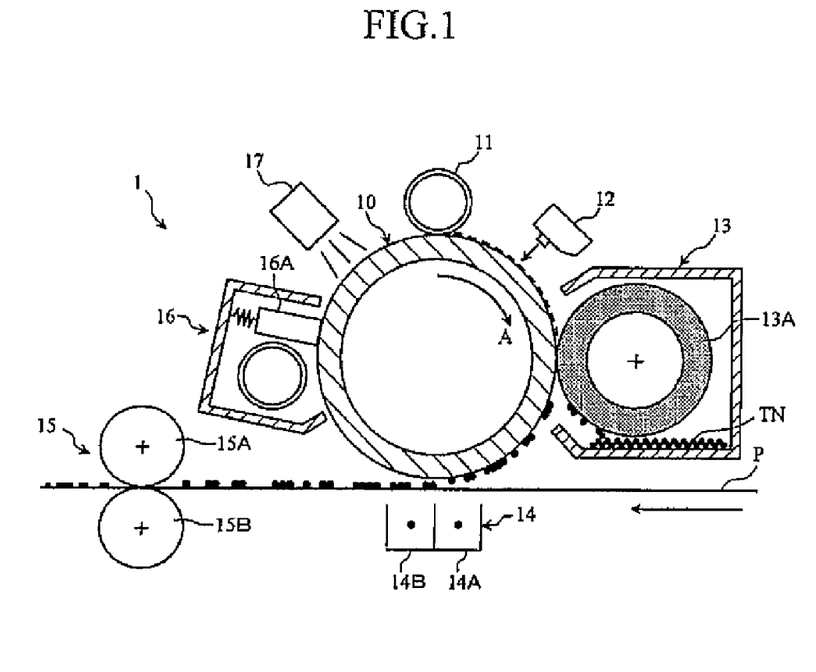
FIG. 1 is a cross sectional diagram illustrating an example of an image forming apparatus according to an embodiment of the present invention.

The image forming apparatus 1 adopts the Carlson method as the method for forming an image. The image forming apparatus 1 is provided with an electronic photosensitive body 10, a charger 11, a light exposure apparatus 12, a developing apparatus 13, a transcriber 14, a fixer 15, a cleaner 16 and a static eliminator 17.

The charger 11 functions to charge the electronic photosensitive body 10 positively or negatively. The voltage for charging is set to 200 V or higher and 1000 V or lower, for example. The charger 11 in the present embodiment is a contact type charger, but a non-contact type charger may be used instead. The contact type charger is provided so as to press against the electronic photosensitive body 10, and formed so that the core metal is coated with a conductive rubber and PVDF (polyvinylidene fluoride), for example. The non-contact type charger is provided at a distance from the electronic photosensitive body 10 and has a discharge wire, for example, in the configuration.

The light exposure apparatus 12 functions to form a static, latent image on the electronic photosensitive body 10. Concretely, the light exposure apparatus 12 makes the electronic photosensitive body 10 irradiated with light for exposure having a certain wavelength (for example 650 nm or more or 780 nm or less) in accordance with the image signal, so that a static, latent image can be formed by attenuating the potential in portions where the electronic photosensitive body 10 is irradiated with light for exposure in a charged state. An LED head where a number of LED elements are aligned, for example, can be adopted as the light exposure apparatus 12.

A light source that can emit a laser beam can be used as the light source for the light exposure apparatus 12 instead of LED elements. That is to say, an optical system that includes a polygon mirror or an optical system that includes lenses and mirrors through which light reflected from the original copy passes can be adopted instead of a light exposure apparatus 12, for example as an LED head, so that an image forming apparatus having the structure of a copier can be provided.

The developing apparatus 13 functions to form a toner image when a static, latent image on the electronic photosensitive body 10 is developed. The developing apparatus 13 according to the present invention is provided with a magnetic roller 13A for magnetically holding the developer (toner) TN.

The developer TN forms a toner image on the surface of the electronic photosensitive body 10 and is charged through friction in the developing apparatus 13. Two-component developers that include a magnetic carrier and an insulating toner and single-component developers that include a magnetic toner can be cited as examples of the developer TN.

The magnetic roller 13A functions to carry the developer to the surface of the electronic photosensitive body 10 (region for development). The magnetic roller 13A carries the developer TN that is charged through friction in the developing apparatus 13 in the form of a magnetic brush of which the length of the bristles can be adjusted to a constant. The carried developer TN adheres to the surface of the photosensitive body as a result of static attraction to the static, latent image, so as to form a toner image in the region for development on the electronic photosensitive body 10 (static, latent image becomes visible). In the case where an image is formed through normal development, the polarity of the charge for the toner image is opposite to the polarity of the charge on the surface of the electronic photosensitive body 10. In the case where an image is formed through reversal development, the polarity of the charge for the toner image is the same as the polarity of the charge on the surface of the electronic photosensitive body 10.

Here, though a dry developing system is adopted in the developing apparatus 13 according to the present invention, a wet developing system using a liquid developer may also be adopted.

The transcriber 14 functions to transcribe a toner image on the electronic photosensitive body 10 to the recording medium P provided in the transcription region between the electronic photosensitive body 10 and the transcriber 14. The transcriber 14 according to the present embodiment is provided with a charger 14A for transcription and a charger 14B for separation. In the transcriber 14, the rear surface (nonrecording surface) of the recording medium P is charged to the polarity opposite to the toner image in the charger 14A for transcription, and the static attraction between this Charge and the toner image transcribes the toner image onto the recording medium P. In addition, in the transcriber 14, the rear surface of the recording medium P is charged with an alternating current in the charger 14B for separation at the same time as the transcription of the toner image, and the recording medium P rapidly separates from the surface of the electronic photosensitive body 10.

It is also possible to provide a transcribing roller that follows the rotation of the electronic photosensitive body 10 at a microscopic distance (usually 0.5 mm or less) from the electronic photosensitive body 10 as the transcriber 14. The transcribing roller is formed so that a transcribing voltage is applied by means of a direct current power supply, for example, and thus, the toner image on the electronic photosensitive body 10 is attracted to the recording medium P. In the case where a transcribing roller is used, the transcription separating apparatus, for example the charger 14B for separation, is unnecessary.

The fixer 15 functions to fix the toner image transcribed onto the recording medium P on the recording medium P, and is provided with a pair of fixing rollers 15A and 15B. The fixing rollers 15A and 15B are made of metal rollers of which the surface is coated with a fluorine resin, for example. In the fixer 15, heat and pressure are applied to the recording medium P, which passes between the pair of fixing rollers 15A and 15B, so that the toner image can be fixed on the recording medium P.

The cleaner 16 functions to remove toner remaining on the surface of the electronic photosensitive body 10, and is provided with a cleaning blade 16A. The cleaning blade 16A functions to scrape remaining toner from the surface of the electronic photosensitive body 10. The cleaning blade 16A has a structure with a desired elasticity and is made of a rubber material of which the main component is a polyurethane resin, for example.

The static eliminator 17 functions to remove the charge from the surface of the electronic photosensitive body 10 and can emit light of a certain wavelength (for example 780 nm or more). The static eliminator 17 is formed so that the charge (remaining static, latent image) on the surface of the electronic photosensitive body 10 is removed through irradiation of the entire surface of the electronic photosensitive body 10 in the axial direction with light from a light source, for example LED's.

Figure 2:
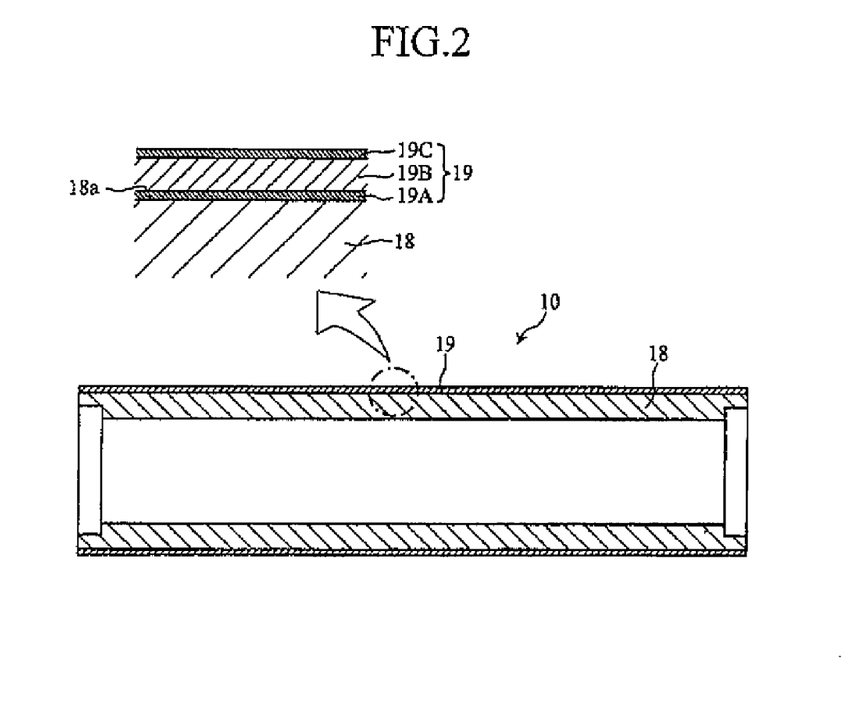
FIG. 2 is a cross sectional diagram showing an example of an electronic photosensitive body according to an embodiment of the present invention with a diagram showing an enlargement of its main portion.

As shown in FIG. 2, the electronic photosensitive body 1 is formed of a photosensitive layer 19 on the outer surface of the base 18.

The base 18 functions as a support for the electronic photosensitive body 1 and is conductive at least on the surface. Though the base 18 in the present embodiment is in cylindrical form, the invention is not limited to this, and the base 18 may be in the form of a closed belt, for example. The base 18 is formed of a metal material or an alloy material including the metal material, and is conductive throughout. Aluminum (Al), stainless steel (SUS), zinc (Zn), copper (Cu), iron (Fe), titanium (Ti), nickel (Ni), chromium (Cr), tantalum (Ta), tin (Sn), gold (Au) and silver (Ag) can be cited as the metal material. In addition, the base 18 may have a structure where the surface of an insulator is coated with a conductive film. Insulating materials, such as resins, glass and ceramics, can be cited as examples of the material for forming the insulator. The metal materials and alloy materials described above, as well as transparent conductive materials, such as ITO (indium tin oxide) or $SnO_2$, can be cited as examples of the material for forming the conductive film. It is preferable for the base 18 having the above described structure to be made of an Al based material, from the point of view of reduction in weight and reduction in cost, and it is more preferable to use an Al based material throughout the entire structure. Al—Mn based alloys, Al—Mg based alloys and Al—Mg—Si based alloys can be cited as Al based materials. Here, a base 18 made of an Al based material is preferable in order to enhance the adhesiveness (and thus the reliability) between the base 18 and the photosensitive layer 19, in the case where the photosensitive layer 19 can be formed of an a-Si based material on the outer surface of the base 18.

A surface process is carried out on the base 18 where a photosensitive layer 19 is formed by means of a lathe. A mirror surface process and a linear trench process can be cited as examples of the surface process.

The photosensitive layer 19 is formed on the outer surface 18a of the base 18. The thickness of the photosensitive layer 19 is set to 15 μm or more and 120 μm or less, for example. In the case where the thickness of the photosensitive layer 19 is 15 μm or more, interference fringes can be reduced in the recorded images, even without a layer for absorbing light of a long wavelength, and in the case where the thickness of the photosensitive layer 19 is 120 μm or less, the photosensitive layer 19 can be prevented from peeling off from the base 18 due to stress.

The photosensitive layer 19 in the present embodiment is formed by layering a charge injection blocking layer 19A, a photoconductive layer 19B and a surface layer 19C in sequence.

The charge injection blocking layer 19A functions to prevent charges from the base 18 side from being injected into the photoconductive layer 19B side. The charge injection blocking layer 19A is formed of a non-single crystal material of which the main body is silicon. Non-single crystal material means materials including at least one of polycrystal, crystallite or amorphous crystal. In the case where the charge injection blocking layer 19A is formed of an amorphous silicon (a-Si) material, for example, a mixed gas of an Si containing gas, such as $SiH_4$ (silane gas), a dopant containing gas, such as $B_2H_6$, and a dilution gas, such as hydrogen ($H_2$) or helium (He), can be cited as an example of the material gas.

The charge injection blocking layer 19A may include at least an element from the thirteenth group of the periodic table (hereinafter referred to as thirteenth group element) or an element from the fifteenth group (hereinafter referred to as fifteenth group element), from the point of view of appropriate formation of an energy barrier. In addition, the charge injection blocking layer 19A may include such an element as carbon (C) or oxygen (O), from the point of view of making the electrical conductivity smaller. The thirteenth group element or fifteenth group element included in the charge injection blocking layer 19A may be distributed in the charge injection blocking layer 19A substantially uniformly, or have a portion where the elements are distributed unevenly in the direction of the layer thickness, but it is preferable for it to be distributed substantially uniformly, from the point of view of reducing remaining charge. In either case, it is preferable for it to be distributed substantially uniformly in a plane parallel to the surface of the base 18, from the point of view of uniformity in the characteristics in the in-plane direction.

In the case where a thirteenth group element and a fifteenth group element are contained in the charge injection blocking layer 19A together with carbon (C) and oxygen (O), the content can be adjusted so that 0.1 ppm or more and 20,000 ppm or less of the thirteenth group element is contained, and 0.1 ppm or more and 10,000 ppm or less of the fifteenth group element is contained. In addition, in the case where no carbon (C) or oxygen (O) element is included in the charge injection blocking layer 19A, the content can be adjusted so that 0.01 ppm or more and 200 ppm or less of the thirteenth group element is contained and 0.01 ppm or more and 100 ppm or less of the fifteenth group element is contained. Here, in the case where the concentration of the thirteenth group element or the fifteenth group element has a gradient in the direction of the layer when the content of the elements is changed over time in the material gas, the thirteenth group element or the fifteenth group element in the photoconductive layer 19B are contained in such an amount that the average content in the photoconductive layer 19B as a whole is within the above described range.

Boron (B), aluminum (Al), gallium (Ga), indium (In) and thallium (Tl) can be cited as examples of the thirteenth group element, and from among these, boron is particularly preferable, from the point of view of ease of control of the concentration for doping at the time of film formation in accordance with a CVD method. Boron hydrides, such as $B_2H_6$, $B_4H_{10}$, $B_5H_9$, $B_5H_{11}$, $B_6H_{10}$, $B_6H_{12}$ and $B_6H_{14}$, boron halides, such as $BF_3$, $BCl_3$ and $BBr_3$, $AlCl_3$, $GaCl_3$, $Ga(CH_3)_3$, $InCl_3$ and $TlCl_3$ can be cited as examples of the material for introducing a thirteenth group element into the charge injection blocking layer 19A.

Phosphorous (P), arsenic (As), antimony (Sb) and bismuth (Bi) can be cited as examples of fifteenth group elements, and from among these, phosphorous is particularly preferable, from the point of view of reducing the distortion in the lattice resulting from the difference in the atomic diameter between the fifteenth group element and the silicon, which is the main body of the non-single crystal material that forms the charge injection blocking layer 19A. Phosphorous hydrides, such as $PH_3$ and $P_2H_4$, phosphorous halides, such as $PF_3$, $PF_5$, $PCl_3$, $PCl_5$, $PBr_3$, $PBr_5$ and $PI_3$, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$ can be cited as an example of the material for introducing a fifteenth group element into the charge injection blocking layer 19A.

At least one element from among carbon, oxygen and nitrogen may be added to the charge injection blocking layer 19A. The element may be added so as to be distributed substantially uniformly in the charge injection blocking layer 19A, or there may be a portion where the element is distributed unevenly in the direction of the layer thickness. Here, in the case where the concentration in the distribution is uneven, it is preferable for the concentration of the added element to be high on the base 18 side, from the point of view of reducing the remaining charge and increasing the adhesion. Here, in either case, it is preferable for the element to be distributed substantially uniformly in a plane direction parallel to the surface of the base 18, from the point of view of the characteristics being uniform in a plane direction.

The thickness of the charge injection blocking layer 19A is set to 0.1 μm or more and 10 μm or less, from the point of view of gaining the desired electronic photograph properties and economical effect. In some cases where the thickness of the charge injection blocking layer 19A is less than 0.1 μm, injection of a charge from the base 18 side cannot be sufficiently blocked, while in some cases where the thickness of the charge injection blocking layer 19A exceeds 10 μm, a charge remains.

The photoconductive layer 19B functions to generate carriers through irradiation with light, such as a laser beam. The photoconductive layer 19B is formed of a non-single crystal material of which the main body is silicon. In the case where the photoconductive layer 19B includes crystallite silicon, the dark conductivity or photoconductivity can be enhanced, and therefore, there is more freedom in design for the photoconductive layer 19B. The crystallite silicon can be formed by changing the conditions for film formation, and in the case where a glow discharge decomposition method is adopted, for example, the temperature of the base 18 and the power of the direct current pulse are set high, and the flow of the dilution gas (for example hydrogen) is high, so that crystallite silicon can be formed.

Concerning the characteristic energy E (eV) that satisfies the following Formula 1 in the relationship with the optical absorption coefficient α ($cm^{-1}$) for a certain wavelength, the characteristic energy E1 for the wavelength of light for exposure is higher than the characteristic energy E2 (eV) for the wavelength for static elimination in the photoconductive layer 19B.

$$\alpha = C \cdot \exp(\hbar\omega/E) \quad \text{[Formula 1]}$$

C: constant
ℏω: photon energy
h: rationalized Planck constant
ω: frequency

In the photoconductive layer 19B, the characteristic energy E1 for the wavelength of light for exposure is more than 0.09 eV and not more than 0.16 eV, for example, preferably 0.10 eV or more and 0.14 eV or less. Furthermore, in the photoconductive layer 19B, the characteristic energy E2 for the wavelength for static elimination is 0.09 eV or less, for example, preferably 0.07 eV or less. Here, taking the conditions for film formation for the photoconductive layer 19B, for example the flow of the used hydrogen gas and the temperature of the substrate, into consideration, it is preferable for the characteristic energy E2 for the wavelength for static elimination to be set to 0.06 eV or more.

It is preferable for the photoconductive layer 19B to include at least hydrogen or a halogen element, from the point of view of compensating for uncombined bonds in the silicon. It is preferable for the sum of hydrogen and the halogen element contained in the photoconductive layer 19B to be 1 atomic % or more and 40 atomic % or less of the sum of silicon, hydrogen and the halogen element. Silicon hydrides (silanes), for example $SiH_4$, $Si_2H_6$, $Si_3H_8$ and $Si_4H_{10}$, can be cited as the material for introducing silicon into the photoconductive layer 19B, and from among these, $SiH_4$ and $Si_2H_6$ are particularly preferable, from the point of view of efficiency in supplying silicon and ease of handling. $F_2$, $BrF$, $ClF$, $ClF_3$, $BrF_3$, $BrF_5$, $IF_3$, $IF_7$, $SiF_4$ and $Si_2F_6$ can be cited as examples of the material for introducing a halogen element into the photoconductive layer 19B. Here, the material for introducing silicon into the photoconductive layer 19B may be diluted by at least $H_2$ or He, if necessary. In order to control the content of hydrogen or halogen element in the photoconductive layer 19B, the temperature of the base 18, the amount of supplied material for introducing elements into the photoconductive layer 19B, and the power for discharge, for example, may be adjusted.

The photoconductive layer 19B may include at least a thirteenth group element or a fifteenth group element in order to gain desired electrical properties, such as dark conductivity, or the properties desired for the optical band gap. In addition, the photoconductive layer 19B may include a carbon (C) or oxygen (O) element in order to adjust the above described properties. The thirteenth group element or fifteenth group element included in the photoconductive layer 19B may be distributed substantially uniformly in the photoconductive layer 19B, or there may be a portion where the element is distributed unevenly in the direction of the layer thickness, but it is preferable for the element to be distributed so that the concentration is lower in the region at the end on the base 18 side than in the region at the end on the surface layer 19C side (side opposite to the base 18), from the point of view of increasing the photosensitivity. Here, in either case, it is preferable for the element to be distributed substantially uniformly in a plane direction parallel to the surface of the base 18, from the point of view of making the properties in the plane direction uniform.

In the case where the photoconductive layer 19B contains a thirteenth group element and a fifteenth group element together with carbon (C) and oxygen (O) elements, or in the case where the photoconductive layer 19B does not contain a carbon (C) or oxygen (O) element, the content is adjusted so that 0.01 ppm or more and 200 ppm or less of the thirteenth group element is contained and 0.01 ppm or more and 100 ppm or less of the fifteenth group element is contained. Here, in the case where the concentration of the elements has a gradient in the direction of the layer thickness when the content of the thirteenth group element or the fifteenth group element in the material gas is changed over time, the average content of the thirteenth group element or fifteenth group element throughout the photoconductive layer 19B must be in the above described range.

The photoconductive layer 19B may contain at least one element from among carbon, oxygen and nitrogen. It is preferable for the sum of the carbon, oxygen and nitrogen contained in the photoconductive layer 19B to be $1\times10^{-5}$ atomic % or more and 2 atomic % or less of the sum of these elements and silicon.

The thickness of the photoconductive layer 19B is set to 5 μm or more and 100 μm or less (preferably 10 μm or more and 80 μm or less), from the point of view of gaining the desired electronic photography properties, and economical effect. In some cases where the thickness of the photoconductive layer 19B is less than 5 μm, sufficient charge function and photosensitivity cannot be secured, while in some cases where the thickness of the photoconductive layer 19B exceeds 100 μm, the time for formation becomes unnecessarily long, which leads to increase in the cost of manufacture.

The surface layer 19C functions mainly to enhance the humidity resistance, the toughness against repeated use, the withstand voltage, the weather proofness and the durability of the electronic photosensitive body 10. The surface layer 19C is formed of a non-single crystal material of which the main component is at least silicon or carbon. In addition, the surface layer 19C has a sufficiently broad optical band gap for the light with which it is irradiated, in order for the light, for example the laser beam, with which the electronic photosensitive body 10 is irradiated not to be absorbed in an inappropriate manner. Furthermore, the surface layer 19C is formed so as to have such a resistance value as to allow a static, latent image to be held during image formation (in general $10^{11}$ Ω·cm or higher).

In the case where the surface layer 19C is formed of an a-SiC based material, a mixed gas of an Si containing gas, such as $SiH_4$ (silane gas) and a C containing gas, such as $CH_4$, can be cited as an example of the material gas. The composition ratio of Si to C in the material gas may change continuously or intermittently. The higher the ratio of C is, the slower the rate of film formation tends to be, and therefore, the surface layer 19C may be formed so that the ratio of C is low in portions of the surface layer 19C that are close to the photoconductive layer 19B, while the ratio of C is high on the free surface side.

In addition, the surface layer 19C may have a two-layer structure where a first SiC layer that is located on the photoconductive layer 19B side (interface side) and the X value (carbon ratio) in the hydrogenated amorphous silicon carbide (a-$Si_{1-x}C_x$: H) exceeds 0 and is less than 0.8, and a second SiC layer where the X value (carbon ratio) is 0.95 or more and less than 1.0 are layered on top of each other. The film thickness of the first SiC layer is usually set to 0.1 μm or more and 2.0 μm or less, preferably 0.2 μm or more and 1.0 μm or less, and optimally 0.3 μm or more and 0.8 μm or less, from the point of view of the withstand voltage, the remaining potential or the strength of the film. The film thickness of the second SiC layer is usually set to 0.01 μm or more and 2 μm or less, preferably 0.02 μm or more and 1.0 μm or less, optimally 0.05 μm or more and 0.8 μm or less, from the point of view of the withstand voltage, the remaining potential, the strength of the film or lifespan (abrasion resistance).

Meanwhile, in the case where the surface layer 19C is formed of an a-C based material, a C containing gas, such as $C_2H_2$ (acetylene gas) and $CH_4$ (methane gas) can be cited as an example of the material gas. The film thickness of the surface layer 19C in this case is usually 0.1 μm or more and 2.0 μm or less, preferably 0.2 μm or more and 1.0 μm or less, and optimally 0.3 μm or more and 0.8 μm or less. Thus, in the case where the surface layer 19C is formed of an a-C based material, the bonding energy in the C—O bond is relatively small in comparison with in the Si—O bond, and therefore, the surface of the surface layer 19C can be prevented from becoming oxidized without fail, as compared to in the case where surface layer 19C is formed of an a-Si based material. That is to say, in the case where the surface layer 19C is formed of an a-C based material, the surface of the surface layer 19C can be prevented more appropriately from becoming oxidized due to the ozone generated through corona discharge during printing, and thus, image deletion can be prevented more appropriately in high temperature, high humidity environments.

It is preferable for the surface layer 19C to include at least hydrogen or a halogen element, from the point of view of compensating for uncombined bonds in the silicon. It is preferable for the hydrogen content in the surface layer 19C to be 1 atomic % or more and 70 atomic % or less (preferably 1 atomic % or more and 45 atomic % or less) of the sum of the component elements. In some cases where the hydrogen content in the surface layer 19C is less than 1 atomic %, the effects that can be gained by providing hydrogen cannot be sufficiently gained, while in some cases where the hydrogen content in the surface layer 19C exceeds 70 atomic %, the charge cannot be sufficiently prevented from becoming trapped when the surface of the surface layer 104 is irradiated with light (which leads to failure to sufficiently prevent image defects resulting from remaining potential).

The thickness of the surface layer 19C is set to 0.2 μm or more and 1.5 μm or less (preferably 0.5 μm or more and 1 μm or less), from the point of view of durability and remaining potential. In some cases where the thickness of the surface layer 19C is less than 0.2 μm, image scratching and inconsistent concentration on the image resulting from friction cannot be sufficiently prevented, while in some cases where the thickness of the surface layer 19C exceeds 1.5 μm, image defects resulting from remaining potential cannot be appropriately prevented.

Figure 3:
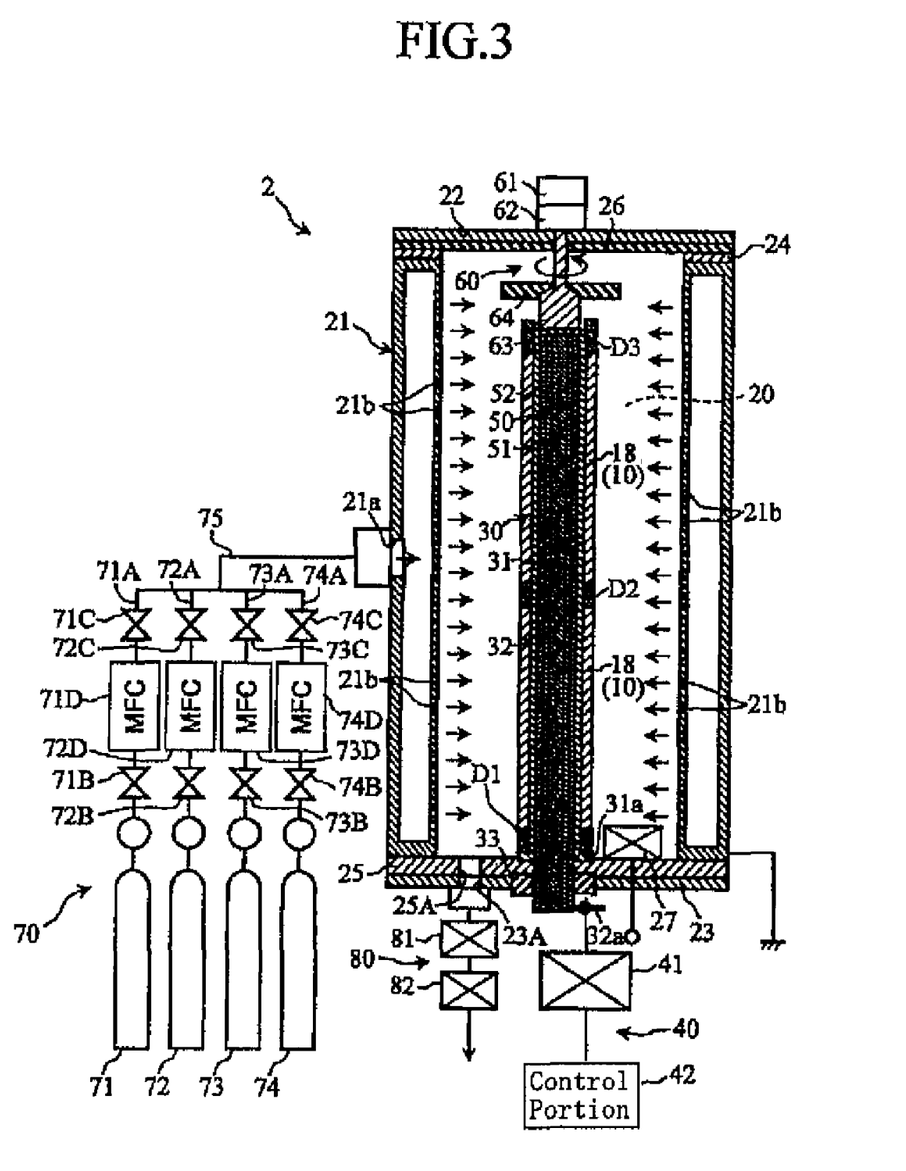
FIG. 3 is a longitudinal cross sectional diagram showing an example of a plasma CVD unit for forming the photosensitive layer in the electronic photosensitive body shown in FIG. 2.

FIG. 3 is a schematic diagram showing an example of the plasma CVD unit 2 for forming the charge injection blocking layer 19A, the photoconductive layer 193 and the surface layer C in the electronic photosensitive body 10.

The plasma CVD unit 2 is provided with a reaction chamber 20, a support mechanism 34, a direct current voltage supplying mechanism 40, a temperature control mechanism 50, a rotation mechanism 60, a gas supplying 70 and a gas discharge mechanism 80.

The reaction chamber 20 provides a space for forming a deposition film on a base 18 and is formed of a cylindrical electrode 21, a pair of plates 22 and 23, and insulating members 24 and 25.

The cylindrical electrode 21 provides a space for forming a deposition film, and at the same time functions as a first conductor. The cylindrical electrode 21 according to the present embodiment is formed of the same conductive material as the base 18, and joined to the pair of plates 22 and 23 via the insulating members 24 and 25. The cylindrical electrode 21 according to the present embodiment is formed so that the distance between the base 18 supported by the supporting mechanism 30 and the cylindrical electrode 21 is 10 mm or more and 100 mm or less. This is because in some cases where the distance between the base 18 and the cylindrical electrode 21 is less than 10 mm, it becomes difficult to gain stable discharge between the base 18 and the cylindrical electrode 21, while in some cases where the distance between the base 18 and the cylindrical electrode 21 is more than 100 mm, the plasma CVD unit 2 becomes larger than necessary, which lowers the productivity per unit area.

The cylindrical electrode 21 has a gas inlet 21a and a number of gas outlets 21b, and is grounded at one end. It is not necessary to ground the cylindrical electrode 21, and it may also have such a structure as to be connected to a reference power supply other than the below described direct current power supply 41. Here, in the case where the cylindrical electrode 21 is connected to a reference power supply other than the direct current power supply 41, the reference voltage in the reference power supply is 1500 V or higher and 1500 V or lower, for example.

The gas inlet 21a is an opening through which a cleaning gas and a material gas are introduced into the reaction chamber 20, and connected to the gas supplying mechanism 70.

The number of gas outlets 21b are openings for blowing out the cleaning gas and material gas introduced into the cylindrical electrode 21 toward the base 18, and are provided at equal intervals in the up-down direction and circumference direction in the figure. The number of gas outlets 21b are all circular and have the same form, and the diameter is 0.5 mm or more and 2.0 mm or less, for example. Here, the diameter, form and arrangement of the number of gas outlets 21b can be modified.

The plate 22 provides such a structure that the reaction chamber 20 can be opened and closed, and the below described support 31 can be put in or taken out from the reaction chamber 20 by opening the plate 22. The plate 22 is formed of the same conductive material as the base 18, and an anti-deposition plate 26 is attached on the bottom side. Thus, a deposition film can be prevented from being formed on the plate 22. Here, the anti-deposition plate 26 is formed of the same conductive material as the base 18 and removable from the plate 22.

The plate 23 functions as a base for the reaction chamber 20 and is formed of the same conductive material as the base 18. The insulating member 25 that intervenes between the plate 23 and the cylindrical electrode 21 functions to suppress arc discharge between the cylindrical electrode 21 and the plate 23. This insulating member 25 can be formed of a glass material (borosilicate glass, soda glass, heat resistant glass), an inorganic insulating material (ceramic, quartz, sapphire), or a synthetic resin insulating material (fluorine resin, polycarbonate, polyethylene terephthalate, polyester, polyethylene, polypropylene, polystyrene, polyamide, vinylon, epoxy, Mylar, PEEK material), for example, and there are no particular limitations as to what material can be used, as long as it has insulating properties, sufficient heat resistance to the temperatures at which it is to be used, and discharges little gas in a vacuum. Here, the insulating member 25 is formed to have a certain thickness or more, in order to prevent it from becoming useless when it warps due to internal stress in the formed film and stress caused by the bimetal effects as the temperature rises during film formation. In the case where the insulating member 25 is formed of a fluorine resin (with a coefficient of thermal expansion of $3 \times 10^{-5}$/K or more and $10 \times 10^{5}$/K or less), for example, the thickness of the insulating member 25 is set to 10 mm or more. In the case where the thickness of the insulating member 25 is set within this range, the degree of warping due to stress generated in the interface between the insulating member 25 and the a-Si film having a thickness of 10 μm or more and 30 μm or less formed on the base 18 can be made 1 mm or less in the difference in height in the axial direction between the end portion and the center portion over a length of 200 mm in the horizontal direction (direction of radius, approximately perpendicular to axial direction of base 18), and thus, it becomes possible to use the insulating member 25 repeatedly.

The plate 23 and the insulating member 25 are provided with gas outlets 23A and 25A, and a pressure gauge 27. The gas outlets 23A and 25A function to discharge gas from the reaction chamber 20, and are connected to the gas discharging mechanism 80. The pressure gauge 27 functions to monitor the pressure in the reaction chamber 20 and any publicly known gauge can be used.

The supporting mechanism 30 supports the base 18 and functions as a second conductor. The supporting mechanism 30 is formed of a support 31, a conductive pillar 32 and an insulator 33. The supporting mechanism 30 according to the present embodiment is formed to have such a length (size) as to be able to support two bases 18, and the support 31 is removable from the conductive pillar 32. In this structure, two bases 18 can be put in and taken out from the reaction chamber 20 without making direct contact on the surface of the two bases 18 supported by the supporting mechanism 30.

The support 31 is a hollow member having a flange 31a, and formed of the same conductive material as the base 18, so that it becomes a conductor as a whole.

The conductive pillar 32 is a cylindrical member having a conductive plate 32a, and formed of the same conductive material as the base 18, so that it becomes a conductor as a whole. The conductive pillar 32 is formed so as to make contact with the inner wall surface of the support 31 in the upper end portion.

The insulator 33 functions to ensure electrical insulation between the conductive pillar 32 and the plate 23, and intervenes between the conductive pillar 32 and the plate 23 at approximately the center of the reaction chamber 20.

The direct current voltage supplying mechanism 40 is a mechanism for supplying a direct current voltage to the conductive pillar 32, and has a direct current power supply 41 and a control portion 42.

The direct current power supply 41 functions to generate a direct current voltage to be applied to the conductive pillar 32, and is connected to the conductive pillar 32 via the conductive plate 32a.

The control portion 42 functions to control the operation of the direct current power supply 41, and is connected to the direct current power supply 41. The control portion 42 is formed so that it can control the operation of the direct current power supply 41 and apply a direct current voltage in pulse form to the support 31 via the conductive pillar 32 (see FIG. 4).

The temperature control mechanism 50 functions to control the temperature of the base 18, and has a ceramic pipe 51 and a heater 52.

The ceramic pipe 51 functions to secure insulating properties and thermal conductivity, and is contained in the conductive pillar 32.

The heater 52 functions to heat the base 18, and is contained in the conductive pillar 32. The temperature of the base 18 is controlled by turning on and off the heater 52 on the basis of the results of monitoring using a thermocouple (not shown) that is attached to the support 31 or the conductive pillar 32, for example. The temperature of the base 18 is kept at a predetermined within a range of 200° C. and 400° C., for example. Here, Nichrome wires and cartridge heaters can be cited as examples of the heater 52.

The rotation mechanism 60 functions to rotate the support 31, and has a rotation motor 61, a rotation introducing terminal 62, an insulating axis member 63 and an insulating plate 64. In the case where a film is formed by rotating the support mechanism 30 by means of the rotation mechanism 60, the base 18 is rotated together with the support 31, and therefore, the components of the decomposed material gas can be deposited approximately uniformly around the outer periphery of the base 18, which is preferable.

The rotation motor 61 functions to provide rotational force to the base 18. The rotation motor 61 is operated under control, so that the base 18 is rotated at a constant rotational speed of 1 rpm or more and 10 rpm or less, for example. Any of a number of publicly known motors can be used as the rotational motor 61.

The rotation introducing terminal 62 functions to transmit rotational force while keeping the reaction chamber 20 at a predetermined degree of vacuum. As the rotation introducing terminal 62, a vacuum sealing means having a rotational axis with a double or triple structure, such as oil seal or mechanical seal, can be used.

The insulating axis member 63 and the insulating plate 64 function to transmit the rotational force of the rotational motor 61 to the support mechanism 30 while maintaining insulation between the support mechanism 30 and the plate 22, and are formed of the same insulating material as the insulating member 25, for example. Here, the outer diameter of the insulating axis member 63 is smaller than the outer diameter of the support 31 (inner diameter of the below described upper dummy base D3) during film formation. Concretely, in the case where the temperature of the base 18 is set to 200° C. or higher and 400° C. or lower during film formation, the outer diameter of the insulating axis member 63 is more than the outer diameter of the support 31 (inner diameter of the below described upper dummy base D3) by 0.1 mm or more and 5 mm or less, preferably by approximately 3 mm. In order to satisfy these conditions, the difference between the outer diameter of the insulating axis member 63 and the outer diameter of the support 31 (inner diameter of the below described upper dummy base D3) has to be 0.6 mm or more and 5.5 mm or less whenever the film is not being formed (under a normal temperature environment (10° C. or higher and 40° C. or lower, for example)).

The insulating plate 64 functions to prevent foreign substances, such as dust and powder, that fall off when the plate 22 is removed from sticking to the base 18. The insulating plate 64 is formed in disc form with a more outer diameter than the inner diameter of the upper dummy base D3. The diameter of the insulating plate 64 is 1.5 times or more and 3.0 times or less of the diameter of the base 18, and in the case where a base 18 having a diameter of 30 mm is used, for example, the diameter of the insulating plate 64 is approximately 50 mm. In the case where such an insulating plate 64 is provided, abnormal discharge can be prevented from being caused by foreign substances sticking to the base 18, and therefore, defects can be reduced during film formation. As a result, the yield when electronic photosensitive bodies 10 are manufactured is higher, and image defects can be prevented, in the case where an image is formed using the electronic photosensitive body 10.

The gas supplying mechanism 70 includes a number of material gas tanks 71, 72, 73 and 74, a number of pipes 71A, 72A, 73A and 74A, valves 71B, 72B, 73B, 74B, 71C, 72C, 73C and 74C, and a number of mass flow controllers 71D, 72D, 73D and 74D, and is connected to the cylindrical electrode 21 via the pipe 75 and the gas inlet 21a.

The material gas tanks 71, 72, 73 and 74 are filled with a material gas. $SiH_4$, $H_2$, $B_2H_6$, $CH_4$, $N_2$ and NO can be used as the material gas, for example.

The valves 71B, 72B, 73B, 74B, 71C, 72C, 73C and 74C and the mass flow controllers 71D, 72D, 73D and 74D function to adjust the amount, the composition and the pressure of the gas components introduced into the reaction chamber 20. Here, in the gas supplying mechanism 70, the type of gas with Which the material gas tanks 71, 72, 73 and 74 are filled and the number of material gas tanks 71, 72, 73 and 74 can be selected on the basis of the type and component of the film to be formed on the base 1B.

The gas discharging mechanism 80 functions to discharge the gas in the reaction chamber 20 via gas outlets 23A and 25A, and has a mechanical booster pump 81 and a rotary pump 82. These pumps 81 and 82 operate under control, on the basis of the results of monitoring using the pressure gauge 27. That is to say, the gas discharging mechanism 80 can keep the reaction chamber 20 at a predetermined vacuum state on the basis of the results of monitoring using the pressure gauge 27 and set the gas pressure in the reaction chamber 20 to a target value. Here, the pressure in the reaction chamber 20 is 1.0 Pa or more and 100 Pa or less, for example.

Next, a method for forming a deposition film using the plasma CVD unit 2 is described citing a case where an electronic photosensitive body 10 (see FIG. 2) is fabricated as an example.

First, the plate 22 is removed from the plasma CVD unit 2 and the support mechanism 30 for holding a number of bases 18 (two in the figure) is set inside the reaction chamber 20, and the plate 22 is reattached. The bases 18 in the support mechanism 30 are supported on the flange 31a of the support 31 when the lower dummy base D1, the base 18, the middle dummy base D2, the base 18 and the upper dummy base D3 are layered in sequence. Bases having such a structure that the entirety is conductive or a conductive film is formed on the surface of an insulator can be cited as examples of the dummy bases D1, D2 and D3, and from among these, bases having the same structure as the bases 18 are particularly preferable. The lower dummy base D1 functions to adjust the height of the bases 18. The middle dummy base D2 functions to suppress arc discharge between the end portions of the adjacent bases 18, and the middle dummy base D2 has such a length that arc discharge can be sufficiently suppressed (for example 1 cm or longer), and a base having corners on the outer peripheral side, on which a curvature process (for example for a radius of curvature of 0.5 mm or more) or a chamfer process (with the portion to be cut off having a length of 0.5 mm or more both in the axial direction and the direction of the depth) is carried out is used. The upper dummy base D3 functions to prevent a deposition film from being formed on the support 31. A base having such a structure as to partially protrude upward from the top of the support 31 is used as the upper dummy base D3.

Next, the temperature of the bases 18 is controlled to a predetermined temperature by means of the temperature control mechanism 50, and at the same time, the pressure in the reaction chamber 20 is reduced by means of the gas discharging mechanism 80. As concerns the control of the temperature of the bases 18, the heater 52 is turned on, so that the temperature rises to in the vicinity of a predetermined temperature, and after that the heater 52 is turned on or off, so that the temperature remains at the predetermined temperature. The temperature of the bases 18 is set on the basis of the type and composition of the film to be formed on the surface, and in the case where an a-Si based film is formed, for example, the temperature is set within a range of 250° C. to 300° C. Meanwhile, the pressure in the reaction chamber 20 is reduced by controlling the operation of the mechanical booster pump 81 and the rotary pump 82, so that the gas is discharged from the reaction chamber 20 via the gas outlets 23A and 25A while monitoring the pressure in the reaction chamber 20 using the pressure gauge 27. Here, the pressure in the reaction chamber 20 is reduced to approximately $1 \times 10^{-3}$ Pa, for example.

Figure 4:
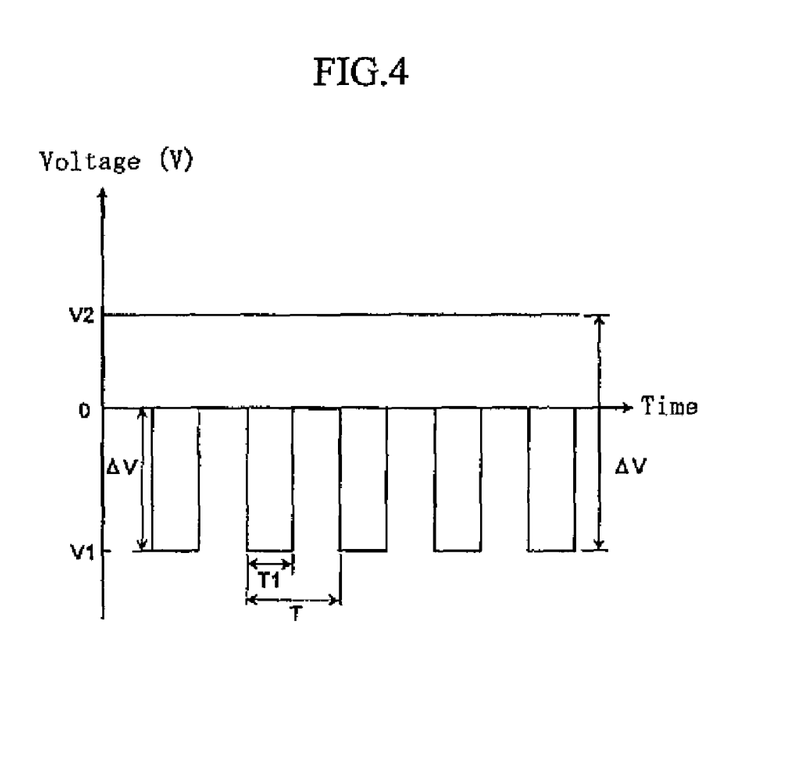
FIG. 4 is a graph illustrating the state of the applied voltage in the plasma CVD unit shown in FIG. 3.

Next, a material gas is supplied to the reaction chamber 20 by means of the gas supplying mechanism 70, and at the same time, a direct current voltage in pulse form is applied across the cylindrical electrode 21 and the support 31 in such a state that the temperature of the bases 18 is kept at the predetermined temperature and the pressure in the reaction chamber 20 is reduced to the predetermined pressure. As a result, there is glow discharge between the cylindrical electrode 21 and the support 31 (bases 18), so that the material gas decomposes, and the resulting components deposit on the surface of the bases 18. In the gas discharging mechanism 80, the operation of the mechanical booster pump 81 and the rotary pump 82 is controlled while monitoring the pressure gauge 27, so that the pressure in the reaction chamber 20 remains within a predetermined range (1.0 Pa or more and 100 Pa or less, for example). That is to say, the pressure in the reaction chamber 20 is kept within a predetermined range by means of the mass flow controllers 71D, 72D, 73D and 74D in the gas supplying mechanism 70 and the pumps 81 and 82 in the gas discharging mechanism 80. The material gas is supplied to the reaction chamber 20 by controlling the mass flow controllers 71D, 72D, 73D and 74D while controlling the state—open or closed—of the valves 71B, 72B, 73B, 74B, 71C, 72C, 73C and 74C so that the material gas having a desired composition and amount in the material gas tanks 71, 72, 73 and 74 is introduced into the cylindrical electrode 21 via the pipes 71A, 72A, 73A, 74A and 75, as well as the gas inlet 21a. The material gas introduced into the cylindrical electrode 21 is blown out toward the bases 18 via a number of gas outlets 21b. Thus, the composition of the material gas is changed by means of the valves 71B, 72B, 73B, 74B, 71C, 72C, 73C and 74C, and the mass flow controllers 71D, 72D, 73D and 74D. Meanwhile, in the case where the cylindrical electrode 21 is grounded, a direct current voltage in pulse form is applied across the cylindrical electrode 21 and the support 31, so that a negative direct current potential in pulse form V1 of −3000 V or more and −50 V or less (preferably −3000 V or more and −500 V or less) can be provided (see FIG. 4), while in the case where the cylindrical electrode 21 is connected to the reference power supply (not shown), the target potential difference ΔV (−3000 V or more and −50 V or less, for example) can be achieved with the potential V2 supplied by the reference power supply as a reference potential. In addition, in the case where a negative voltage in pulse form (see FIG. 4) is applied to the support 31 (bases 18), the potential V2 supplied by the reference power supply is set to 1500 V or more and 1500 V or lower, for example. The control portion 42 controls the direct current power supply 41 so that the frequency (1/T (sec)) of the direct current voltage becomes 300 kHz or less and the duty ratio (T1/T) becomes 20% or more and 90% or less. The duty ratio according to the present embodiment is defined as the time ratio of the time T1 during which there is a difference in potential occupied in the period T of the direct current voltage in pulse form (time between one instant when there is a difference in potential between the bases 18 and the cylindrical electrode 21 and the next instant when there is a difference in potential), as shown in FIG. 4. A duty ratio of 20%, for example, means that the time during which there is a difference in potential is 20% of one whole period when a voltage in pulse form is applied. As described above, the charge injection blocking layer 19A, the photoconductive layer 19B and the surface layer 19C are formed and layered in sequence on the surface of the bases 18.

The present inventor found that in the case where a plasma CVD method using a direct current voltage in pulse form as described above is used, it is possible to form a photoconductive layer 19B where the characteristic energy E1 for the wavelength of light for exposure (650 nm or higher and 780 nm or lower, for example) is more than the characteristic energy E2 for the wavelength for static elimination (780 nm or higher, for example) by adjusting the rate of film formation, although the reason why is unsure. It is assumed that a low rate of film formation makes physical impact on the film smaller, and as a result, the characteristic energy becomes smaller. That is to say, the rate of film formation is adjusted in such a manner that the characteristic energy is small in a region where light reaches deep due to a high wavelength and the characteristic energy is great in a region where it is difficult for light to reach deep due to a low wavelength, and thus, an electronic photosensitive body 10 having a photoconductive layer 19B can be gained.

Meanwhile, the present inventor found that the characteristic energy E2 for the wavelength of static elimination affects the memory value more than the characteristic energy E1 for the wavelength of light for exposure.

That is to say, the inverse number of the characteristic energy E mutually relates to the amount of carriers captured by a band tail as described above, and in the region that is referred to as exponential tail, the more the inverse number (1/E) of the characteristic energy E is, the fewer the carriers that are captured by the band tail are. Therefore, in the case where the characteristic energy E1 for the wavelength of light for exposure is more than the characteristic energy E2 for the wavelength for static elimination (in the case where the inverse number (1/E2) of the characteristic energy E2 for the wavelength for static elimination is more than the inverse number (1/E1) of the characteristic energy E1 for the wavelength of light for exposure), the carriers remaining after the exposure to light can be efficiently dispersed during static elimination. That is to say, even in the case where the photoconductive layer 19B has a characteristic energy E1 that is relatively great for the wavelength of light for exposure, the remaining carriers can be dispersed by light for static elimination, and therefore, the memory can be prevented from remaining until the next image formation.

In addition, the electronic photosensitive body 10 can allow the characteristic energy E1 for the wavelength of light for exposure to be relatively high, and therefore, the rate of film formation for the photoconductive layer 19B can be increased or the amount of used material gas can be reduced.

Accordingly, the electronic photosensitive body 10 is excellent in the productivity aspect.

Example 1

In the present example, the characteristic energy of the photoconductive layer in an electronic photosensitive body was evaluated.

(Fabrication of Electronic Photosensitive Body)

An electronic photosensitive body was fabricated by forming only a photoconductive layer on a cylindrical base under the conditions shown in the following Table 1.

TABLE 1

| | | Photoconductive layer | | | | |
|---|---|---|---|---|---|---|
| | | Sample 1 | Sample 2 | Sample 3 | Sample 4 | Sample 5 |
| material gases | SiH$_4$ (sccm) | 340 | 340 | 340 | 340 | 340 |
| | H$_2$ (sccm) | 200 | 200 | 200 | 200 | 200 |
| | B$_2$H$_6$ (sccm) | 0.3 | 0.3 | 0.3 | 0.3 | 0.3 |
| | CH$_4$ (sccm) | 0 | 0 | 0 | 0 | 0 |
| pressure (Pa) | | 80 | 80 | 80 | 80 | 80 |
| base temperature (° C.) | | 320 | 320 | 320 | 260 | 260 |
| direct current voltage (V) | | −670 | −740 | −900 | — | — |
| RF power (W) | | — | — | — | 150 | 300 |
| film thickness (μm) | | 20 | 20 | 20 | 20 | 20 |

A cylindrical base having an outer diameter of 84 mm and a length of 360 mm made substantially of aluminum was used.

In Samples 1, 2 and 3, the photoconductive layers were formed using the plasma CVD unit 2 shown in FIG. 3. The direct current voltage was a direct current voltage in pulse form having a pulse frequency of 30 kHz and a duty ratio of 50% and was applied in such a manner that the support became of a negative polarity. In addition, the rotational speed of the cylindrical base was set to 10 rpm during film formation for the photoconductive layer.

Meanwhile, in Samples 4 and 5, the photoconductive layers were formed using the plasma CVD unit 2 shown in FIG. 3 with a high frequency oscillator instead of the direct current power supply 34. During film formation for the photoconductive layer, the frequency was 13.56 MHz and the rotational speed of the cylindrical base was set to 10 rpm.

(Calculation of Characteristic Energy)

The characteristic energy E was calculated as the inverse number of the photon energy (hω) relative to the logarithm (ln α) of the optical absorption coefficient (α) on the basis of the following formula 2.

$$\ln \alpha = (1/E) \cdot \hbar \omega + \ln C \quad \text{[Formula 2]}$$

In the formula 2, C is a constant, h is a rationalized Planck constant, and ω is the frequency.

(Derivation of Optical Absorption Coefficient)

The optical absorption coefficient was derived on the basis of the results when measured using an ultraviolet and visible spectrophotometer. Concretely, a single layer film having a thickness of approximately 1 μm was formed on a glass substrate so that a test piece was fabricated, and after that, the transmittance of the light with which the fabricated test piece was irradiated and which transmitted through the test piece was measured using an ultraviolet and visible spectrophotometer (Model Number: UV-2400PC, made by Shimadzu Corporation) (wavelength range: 400 nm to 800 nm), and on the basis of the results, the optical absorption coefficient of the electronic photosensitive bodies was calculated. The relationship between the optical absorption coefficient and the wavelength in the test pieces was shown in FIGS. 5 to 9 with the photon energy (hω) taken along the lateral axis and the logarithm of the optical absorption coefficient (ln α) taken along the longitudinal axis.

Figure 5:
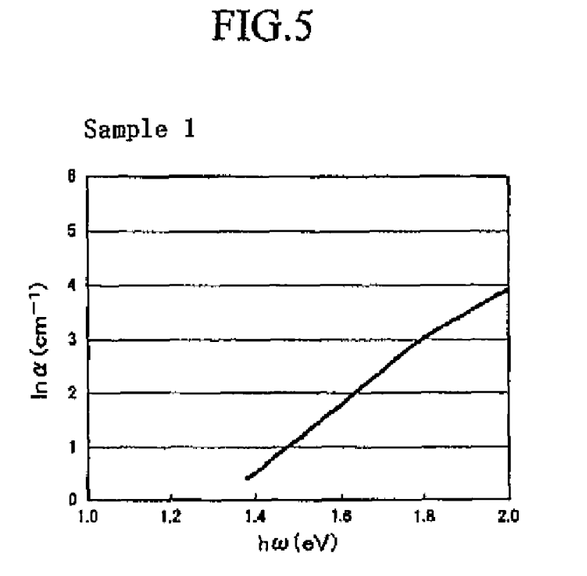
FIG. 5 is a graph showing the relationship between the photon energy (hω) and the optical absorption coefficient in Sample 1 according to Example 2.
Figure 6:
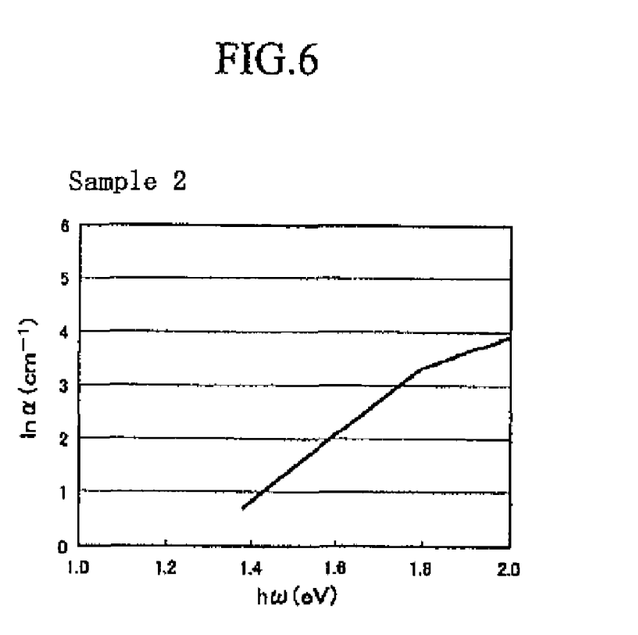
FIG. 6 is a graph showing the relationship between the photon energy (hω) and the optical absorption coefficient α in Sample 2 according to Example 2.
Figure 7:
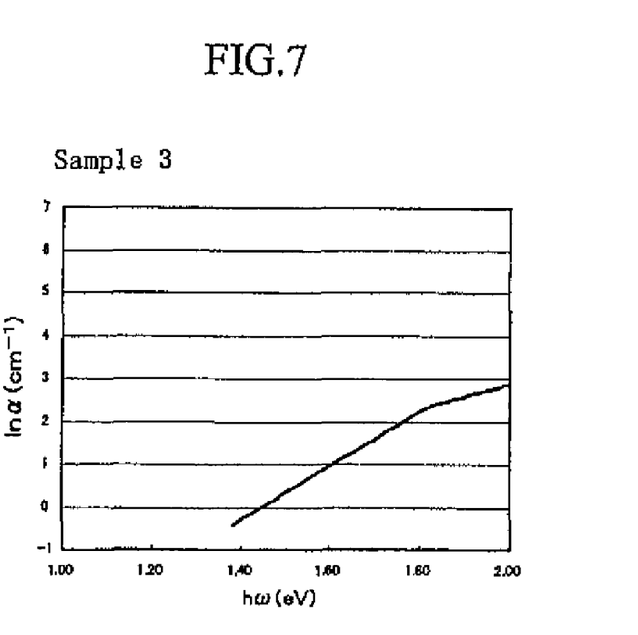
FIG. 7 is a graph showing the relationship between the photon energy (hω) and the optical absorption coefficient α in Sample 3 according to Example 2.

As can be seen from these figures, in Samples 1, 2 and 3 where the photoconductive layers were formed by applying a direct current voltage in pulse form while adjusting the rate of film formation to a desired value, the more hω was, the more ln α increased, and the two lines having different inclinations were continuous. That is to say, the characteristic energy was different before and after the intersection of the two lines, and the characteristic energy of light having a wavelength shorter than the bordering wavelength that corresponds to the intersection of the two lines was more than the characteristic energy of light having a wavelength longer than the above described bordering wavelength. At the intersection of the two lines, hω was approximately 1.80 eV, which corresponds to a wavelength of approximately 690 nm to 700 nm.

Figure 8:
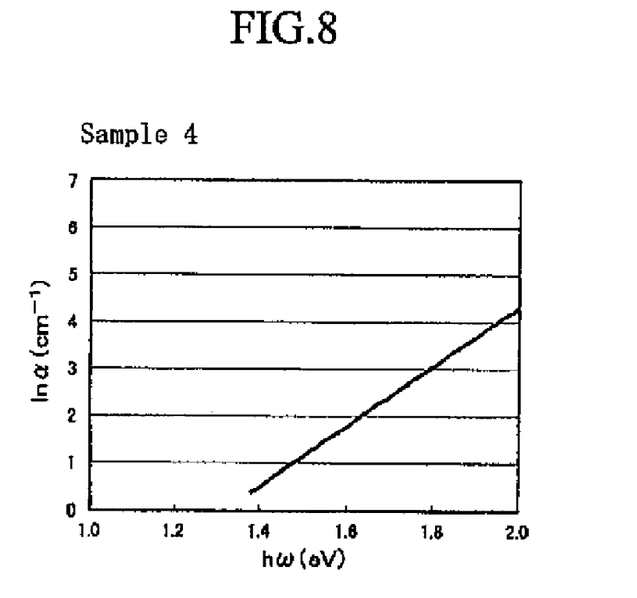
FIG. 8 is a graph showing the relationship between the photon energy (hω) and the optical absorption coefficient α in Sample 4 according to Example 2.
Figure 9:
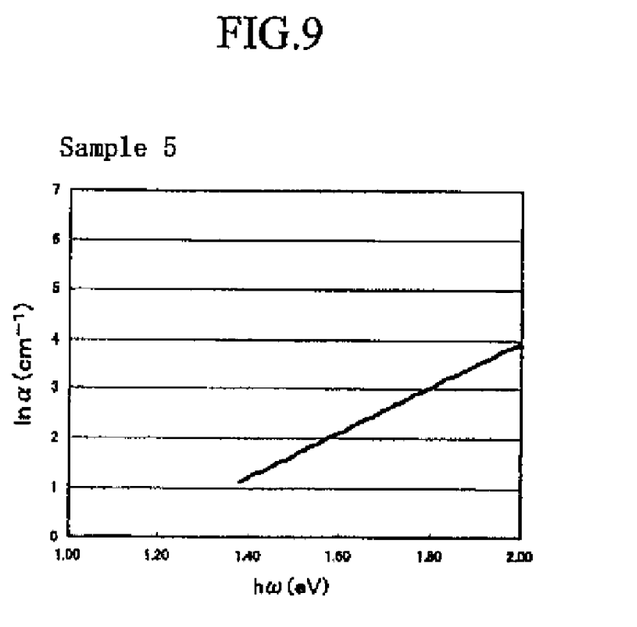
FIG. 9 is a graph showing the relationship between the photon energy (hω) and the optical absorption coefficient α in Sample 5 according to Example 2.

In contrast, in Samples 4 and 5 where the photoconductive layers were formed by supplying a high frequency power, the relationship was in a form of one line where ln α increases by a constant ratio as hω increases.

Here, the characteristic energy, which is the inverse number of the inclination, was calculated in Samples 1, 2 3, 4 and 5, and the results are shown in the following Table 2.

TABLE 2

| | characteristic energy E | |
|---|---|---|
| Sample 1 | 0.10 eV | 0.07 eV |
| Sample 2 | 0.14 eV | 0.07 eV |
| Sample 3 | 0.16 eV | 0.07 eV |
| Sample 4 | 0.07 eV | |
| Sample 5 | 0.10 eV | |

Example 2

In the present example, the effects of the characteristic energies E1 and E2 of the photoconductive layer for light for exposure and light for static elimination on the memory properties in electronic photosensitive bodies were examined. In addition, in the present example, the voltage for charging electronic photosensitive bodies and the speed of film formation for the photoconductive layer were also evaluated.

(Fabrication of Electronic Photosensitive Bodies)

Electronic photosensitive bodies were formed by layering a charge injection blocking layer, a photoconductive layer and a surface layer in sequence on top of a cylindrical base. In Samples 1, 2, 3, 4 and 5, the charge injection blocking layer was formed under the conditions shown in the following Table 3, the photoconductive layer was formed under the conditions shown in the above Table 1, and the surface layer was formed under the conditions shown in the following Table 4. In Sample 6, the charge injection blocking layer, the photoconductive layer and the surface layer were formed and layered in sequence under the same conditions as for Sample 1, except that the direct current voltage for forming the photoconductive layer was −580 V.

TABLE 3

Charge injection blocking layer

| | | Sample 1 | Sample 2 | Sample 3 | Sample 4 | sample 5 |
|---|---|---|---|---|---|---|
| material gases | $SiH_4$ (sccm) | 170 | 170 | 170 | 170 | 170 |
| | $H_2$ (sccm) | 200 | 200 | 200 | 200 | 200 |
| | $B_2H_6$ (sccm) | 1150 | 1150 | 1150 | 1150 | 1150 |
| | $CH_4$ (sccm) | 0 | 0 | 0 | 0 | 0 |
| pressure (Pa) | | 80 | 80 | 80 | 80 | 80 |
| base temperature (° C.) | | 320 | 300 | 300 | 260 | 260 |
| direct current voltage (V) | | −600 | −600 | −600 | — | — |
| RF power (W) | | — | — | — | 110 | 110 |
| film thickness (μm) | | 5 | 5 | 5 | 20 | 20 |

TABLE 4

Surface layer

| | | Sample 1 | Sample 2 | Sample 3 | Sample 4 | Sample 5 |
|---|---|---|---|---|---|---|
| material gases | $SiH_4$ (sccm) | 30 | 30 | 30 | 30 | 30 |
| | $H_2$ (sccm) | 0 | 0 | 0 | 200 | 200 |
| | $B_2H_6$ (sccm) | 0 | 0 | 0 | 0 | 0 |
| | $CH_4$ (sccm) | 600 | 600 | 600 | 230 | 230 |
| pressure (Pa) | | 86.5 | 86.5 | 86.5 | 86.5 | 86.5 |
| base temperature (° C.) | | 250 | 250 | 250 | 250 | 250 |
| direct current voltage (V) | | −280 | −280 | −280 | — | — |
| RF power (W) | | — | — | — | 150 | 150 |
| film thickness (μm) | | 1 | 1 | 1 | 1 | 1 |

In Samples 1, 2 and 3, the charge injection blocking layer, the photoconductive layer and the surface layer were formed using the plasma CVD unit 2 shown in FIG. 3. The direct current voltage was a direct current voltage in pulse form having a pulse frequency of 30 kHz and a duty ratio of 50% and was applied so that the support became of a negative polarity. In addition, the rotational speed of the cylindrical base was set to 10 rpm during film formation for the layers.

Meanwhile, in Samples 4 and 5, the charge injection blocking layer, the photoconductive layer and the surface layer were formed using a high frequency oscillator instead of the direct current power supply 34 in the plasma CVD unit 2 shown in FIG. 3. During film formation for the layers, the frequency was 13.56 MHz and the rotational speed of the cylindrical base was set to 10 rpm.

(Memory Properties)

The memory properties were evaluated by checking whether or not an image remained after the first rotation of the electronic photosensitive body so as to appear during the second rotation when an electronic photosensitive body was built into an image forming apparatus (Model Number: KM-8030, made by Kyocera Mita Corp.) and an image was printed. In the image forming apparatus, the wavelength of light for exposure was set to 680 nm (photon energy hω of light for exposure was 1.82 eV) and the wavelength for static elimination was set to 780 nm (photon energy hω of light for static elimination was 1.59 eV).

As for the memory properties, cases where the image in the first rotation was not visible in the second rotation are indicated by ⊙, cases where the image in the first rotation was slightly visible in the second rotation but sufficiently tolerable for practical use are indicated by ○, cases where the image in the first rotation was visible in the second rotation but tolerable for practical use are indicated by Δ, and cases where the image in the first rotation was sufficiently visible in the second rotation and thus, not tolerable for practical use, are indicated by x. The results are shown in the following Table 5.

TABLE 5

| | characteristic energy | | | | |
|---|---|---|---|---|---|
| | E1 (light for exposure) | E2 (light for static removal) | memory properties | charge voltage | rate of film formation |
| Sample 1 | 0.1 eV | 0.07 eV | ⊙ | 300 V | ○ |
| Sample 2 | 0.14 eV | 0.07 eV | ○ | 300 V | ○ |
| Sample 3 | 0.16 eV | 0.07 eV | Δ | 300 V | ⊙ |
| Sample 4 | 0.07 eV | 0.07 eV | ⊙ | 300 V | X |
| Sample 5 | 0.1 eV | 0.1 eV | X | 270 V | ○ |
| Sample 6 | 0.1 eV | 0.05 eV | ⊙ | 290 V | ○ |

(Evaluation of Charge Voltage)

The charge voltage was evaluated by checking the voltage in a constant state (charge voltage in stable state) after repeated exposure to light and static elimination a number of times. The results are shown in Table 5 as well.

(Evaluation of Rate of Film Formation)

As for the rate of film formation, the rate of film formation according to a conventional method (for example, Sample 5) was used as a reference, and cases where the same rate of film formation as the reference can be maintained are indicated by ○, cases where the rate of film formation increased in comparison with the conventional method are indicated by ⊙, and cases where the rate of film formation lowered greatly are indicated by x.

As can be seen from Table 5, in Samples 1, 2 and 6, the memory properties were excellent, the charge voltage was high and the rate of film formation was excellent. In Sample 3, the memory properties were slightly poorer than in Samples 1 and 2, but not to such a degree as to have a problem with practical use, and the charge voltage was high and the rate of film formation was excellent.

In Sample 4, there were no problems with the memory properties and the charge voltage, but the rate of film formation was extremely low. In Sample 5, the memory properties were insufficient and the charge properties were also low.

In Samples 1, 2, 3 and 6 where good results were gained, a film was formed by applying a direct current voltage in pulse form, and the characteristic energy E1 for the wavelength of light for exposure was more than the characteristic energy E2 for the wavelength for static elimination. In contrast, in Samples 4 and 5 where no good results were gained, a film was formed by supplying an RF power, and the characteristic energy E1 for the wavelength of light for exposure and the characteristic energy E2 for the wavelength for static elimination were approximately the same.

Accordingly, when the characteristic energy E1 for the wavelength of light for exposure was more than the characteristic energy E2 for the wavelength for static elimination, the characteristic energy E1 for the wavelength of light for exposure was in a range of 0.1 eV to 0.16 eV and the characteristic energy E2 for the wavelength for static elimination was 0.07 eV or less, for example, the memory properties did not have problems with practical use, the charge voltage was excellent, and the rate for film formation was high. That is to say, the electronic photosensitive bodies in Samples 1, 2 and 3 were sufficiently practical even when they were provided with a photoconductive layer having a characteristic energy E1 for the wavelength of light for exposure of 0.1 eV or higher, which was said to provide poor memory properties according to the prior art, and the manufacture was possible even with a relatively high rate of film formation so that the productivity could be increased.

In addition, the photoconductive layer having the above described characteristic energy can be formed using a direct current voltage in pulse form, and it is not necessary to supply a specifically great amount of material gas at this time or it is not necessary for the temperature at which the cylindrical base is heated to be specifically high. Thus, it is possible to produce an electronic photosensitive body having memory properties without a problem with practical use at a low cost of manufacture.

EXPLANATION OF SYMBOLS

| | |
|---|---|
| 1 | image forming apparatus |
| 10 | electronic photosensitive body |
| 18 | cylindrical base (base) |
| 19B | photoconductive layer |
| 3 | support (first conductor) |
| 4 | reaction chamber |
| 40 | cylindrical electrode (second conductor) |

The invention claimed is:

1. An electronic photosensitive body, comprising a base and a photoconductive layer formed on the base and containing a non-single crystal material of which the main body is silicon, wherein, a characteristic energy E (eV) that satisfies a Formula 1 in terms of the relationship with the optical absorption coefficient α (cm$^{-1}$) in said photoconductive layer, a characteristic energy E1 for the wavelength of light for exposure whose photon energy hω is more than 1.80 eV is more than a characteristic energy E2 (eV) for the wavelength for static elimination whose photon energy is less than 1.80 eV:

$$\alpha = C \cdot \exp(h\omega/E) \quad \text{[Formula 1]}$$

C: constant
hω: photon energy
h: rationalized Planck constant
ω: frequency.

2. The electronic photosensitive body according to claim 1, wherein the characteristic energy E1 for the wavelength of light for exposure is more than 0.09 eV and 0.16 eV or less.

3. The electronic photosensitive body according to claim 2, wherein the characteristic energy E1 for the wavelength of light for exposure is 0.1 eV or more and 0.14 eV or less.

4. The electronic photosensitive body according to claim 1, wherein the characteristic energy E2 for the wavelength for static elimination is 0.09 eV or less.

5. The electronic photosensitive body according to claim 4, wherein the characteristic energy E2 for the wavelength for static elimination is 0.07 eV or less.

6. The electronic photosensitive body according to claim 4, wherein the characteristic energy E2 for the wavelength for static elimination is 0.06 eV or more.

7. The electronic photosensitive body according to claim 1, wherein said non-single crystal material has amorphous silicon as its main component.

8. The electronic photosensitive body according to claim 1, wherein said non-single crystal material includes crystallite silicon.

9. The electronic photosensitive body according to claim 1, further comprising a surface layer containing hydrogenated amorphous silicon carbide (a-Si$_{1-X}$C$_X$: H) on said photoconductive layer, wherein
said surface layer includes a first layer having a value X which exceeds 0 and is less than 0.8 and a second layer formed and layered on the first layer and having a value X which is 0.95 or more and less than 1.0.

10. The electronic photosensitive body according to claim 1, further comprising a surface layer containing amorphous carbon on said photoconductive layer.

11. A manufacturing method for the electronic photosensitive body according to claim 1, comprising:
allowing a first conductor to support said base in a reaction chamber;
introducing a reactive gas atmosphere into said reaction chamber; and
applying a direct current voltage in pulse form across said first conductor and a second conductor provided at a distance from said first conductor in said reaction chamber.

12. An image forming apparatus comprising the electronic photosensitive body according to claim 1, a light exposure apparatus for exposing said electronic photosensitive body to light, and a static eliminator for eliminating static electricity from said electronic photosensitive body.

13. The image forming apparatus according to claim 12, wherein the wavelength of light for exposure emitted from said light exposure apparatus is shorter than the wavelength of light for static elimination emitted from said static eliminator.

14. The image forming apparatus according to claim 13, wherein said wavelength of light for exposure is 650 nm or higher and 690 nm or lower and said wavelength of light for static elimination is 780 nm or higher.

* * * * *